United States Patent
Van Vaals

(10) Patent No.: US 6,430,429 B1
(45) Date of Patent: *Aug. 6, 2002

(54) MAGNETIC RESONANCE IMAGING SYSTEM WITH AN INTERVENTIONAL INSTRUMENT

(75) Inventor: Johannes J. Van Vaals, Eindhoven (NL)

(73) Assignee: Koninklijke Philips Electronics, N.V., Eindhoven (NL)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/453,421

(22) Filed: Dec. 2, 1999

(30) Foreign Application Priority Data

Dec. 3, 1998 (EP) .............................. 98204105

(51) Int. Cl.7 ................................ A61B 5/05
(52) U.S. Cl. ................ 600/410; 600/411; 600/412; 600/421; 600/424; 324/318; 324/322
(58) Field of Search .................. 600/410, 411, 600/412, 421, 424, 407, 409; 324/318, 322

(56) References Cited

U.S. PATENT DOCUMENTS

| | | | | |
|---|---|---|---|---|
| 5,432,450 A | * | 7/1995 | Rubinson | 324/318 |
| 5,810,728 A | * | 9/1998 | Kuhn | 600/410 |
| 5,868,674 A | * | 2/1999 | Glowinski et al. | 600/410 |

* cited by examiner

Primary Examiner—Marvin M. Lateef
Assistant Examiner—Lin Jeoyuh
(74) Attorney, Agent, or Firm—John Vodopia

(57) ABSTRACT

A magnetic resonance imaging (MRI) system is provided with an interventional instrument with an indicator element which influences, for example locally disturbs, the magnetic resonance image. The position of the interventional instrument within the patient to be examined is derived from the local disturbances in the image as caused by the interventional instrument. The degree of influencing of the magnetic resonance image is adjustable notably by rotation of the interventional instrument with the indicator element relative to the direction of the steady magnetic field of the magnetic resonance imaging system. For example, the indicator element is a paramagnetic strip which may include several segments of different magnetic susceptibility.

8 Claims, 2 Drawing Sheets

MAGNETIC RESONANCE IMAGING SYSTEM WITH AN INTERVENTIONAL INSTRUMENT

BACKGROUND OF THE INVENTION

1. Field of the Invention

The invention relates to magnetic resonance imaging system which includes: an interventional instrument which is provided with an indicator element for influencing a magnetic resonance image. The invention also relates to an interventional instrument which is intended to co-operate with a magnetic resonance imaging system and is provided with an indicator element for influencing a magnetic resonance image.

2. Description of Related Art

A magnetic resonance imaging system of this kind is used notably for a medical interventional procedure during which the interventional instrument is introduced into the body of the patient to be examined. During the introduction of the interventional instrument one or more magnetic resonance images are made of the patient to be examined. Because the indicator element influences the magnetic resonance image, the position of the interventional instrument can be picked up and the instantaneous position of the interventional instrument can also be reproduced in a rendition of the magnetic resonance image. The indicator element preferably induces a local disturbance in the magnetic resonance image. On the basis of the magnetic resonance images the interventional instrument can thus be tracked inside the body, even though it is obscured from direct view.

An interventional instrument of this kind is known from United States patent U.S. Pat. No. 5,728,079. The cited patent also mentions a magnetic resonance imaging system provided with such an interventional instrument.

The known interventional instrument is a catheter provided with a hollow tubular holder and the indicator element is a concentric layer of a paramagnetic material. The concentric paramagnetic layer is provided in the form of a cylindrical sheath whose longitudinal axis is coincident with the longitudinal axis of the holder. The paramagnetic material influences the magnetic resonance image of a patient to be examined by means of the magnetic resonance imaging system. The influencing of the magnetic resonance image makes it possible to derive the position of the interventional instrument within the body of the patient without the instrument being directly visible. The influencing of the magnetic resonance image by the paramagnetic layer has an adverse effect on the diagnostic quality of the magnetic resonance image. Due to the influencing by the indicator element, notably anatomical details in the vicinity of the position of the interventional instrument are reproduced in a disturbed manner.

Citation of a reference herein, or throughout this specification, is not to construed as an admission that such reference is prior art to the Applicant's invention of the invention subsequently claimed.

SUMMARY OF THE INVENTION

It is an object of the invention to provide a magnetic resonance imaging system with an interventional instrument in which the position of the interventional instrument within the body of the patient to be examined can be more accurately derived by influencing the magnetic resonance image and/or in which the magnetic resonance image is disturbed less than by the known interventional instrument. It is notably an object of the invention to provide a magnetic resonance imaging system with an interventional instrument whereby the position of the interventional instrument can be accurately derived without seriously affecting the diagnostic quality of the magnetic resonance image.

This object is achieved by means of a magnetic resonance imaging system according to the invention which is characterized in that the degree of influencing of the magnetic resonance image is adjustable.

The magnetic resonance imaging system according to the invention is particularly suitable for use during an intervention. During an intervention the interventional instrument, for example, a catheter, is introduced into the body of the patient and magnetic resonance images of the body of the patient to be examined are then formed, the interventional instrument being reproduced therein. The influencing of the magnetic resonance image represents the position of the interventional instrument; this enables the position of the interventional instrument to be derived from the influencing of the magnetic resonance image. Notably, the small region in the magnetic resonance image which is influenced corresponds with the position of the interventinal instrument.

Because the influencing of the magnetic resonance images by the interventional instrument is adjustable, on the one hand the magnetic resonance images can be strongly influenced so that the position of the interventional instrument can be clearly observed in the magnetic resonance images. On the other hand, through very weak influencing of the magnetic resonance images by the interventional instrument it can be ensured that the diagnostic quality of the magnetic resonance images is hardly degraded by the interventional instrument. In the case of very weak influencing, the magnetic resonance image accurately reproduces the anatomy of the patient to be examined. As a result, the position of the interventional instrument within the body of the patient can be accurately derived. For example, magnetic resonance images are formed during the introduction of the interventional instrument, the interventional instrument then influencing the magnetic resonance images to a substantial degree so that the interventional instrument can be readily tracked in the magnetic resonance images. As a result, the interventional instrument is clearly reproduced in the magnetic resonance image so that the interventional instrument can be tracked within the body of the patient without being directly visible. The interventional instrument can thus be safely guided through the body of the patient without unnecessary damaging of tissue. Once the interventional instrument has been guided to the desired position, the degree of influencing of the magnetic resonance images is reduced as much as possible. Magnetic resonance images in which hardly any disturbances occur can then be formed of the body of the patient. Such magnetic resonance images have a high diagnostic quality because they reproduce the anatomy of the patient to be examined with many details and exactly. When subsequently the interventional instrument is moved again, the degree of influencing of the magnetic resonance images by the interventional instrument is adjusted to a higher value again, so that the interventional instrument can be suitably tracked in the magnetic resonance images. The degree of influencing of the magnetic resonance images can notably be adjusted in such a manner that anatomical details are reproduced in the magnetic resonance image with only few disturbances, the disturbance nevertheless being sufficient for accurate determination of the position of the interventional instrument.

The indicator element causes the influencing of the magnetic resonance image. Such influencing is produced by the magnetic properties of the indicator element. Specifically, the magnetic susceptibility of the indicator element deviates essentially or even considerably from the magnetic susceptibility of other parts, such as the holder, of the interventional instrument. Furthermore, the magnetic susceptibility of the indicator element preferably deviates significantly from the magnetic susceptibility of the tissue in the vicinity of the indicator element. It is thus achieved that the indicator element can induce a distinct disturbance in the magnetic resonance image, so that the indicator element can be clearly reproduced in relation to the anatomical structures in the magnetic resonance image. Preferably, the degree of influencing of the magnetic resonance image by the interventional instrument is adjustable by adjustment of the orientation of the indicator element relative to the steady magnetic field of the magnetic resonance imaging system. Generally speaking, the orientation of the indicator element can be readily controlled without influencing the interventional functions of the interventional instrument. This is because the interventional instrument is usually shaped as an elongate holder which can be rotated about its longitudinal axis within the body within the body of the patient to be examined. When the holder is rotated about its longitudinal axis, the indicator element is also rotated relative to the steady magnetic field. Evidently, it is also possible to construct the interventional instrument in such a manner that the indicator element can be rotated, inside the holder, relative to the steady magnetic field, without the holder being rotated. The interventional instrument is then moved within the body of the patient while the elongate holder has an orientation relative to the steady magnetic field such that considerable influencing of the magnetic resonance images occurs. Attractive results are achieved notably when the longitudinal axis of the holder encloses a significant angle relative to the direction of the steady magnetic field. In the vast majority of interventional procedures the interventional instrument is indeed used in such a manner that the longitudinal axis of the instrument is not directed parallel to the direction of the steady magnetic field.

With the exception of the indicator element of the interventional instrument, the components, such as the holder, preferably have a magnetic susceptibility which does not influence or only hardly influences the magnetic resonance image, whereas the indicator element has a magnetic susceptibility which is capable of strongly influencing the magnetic resonance image. It has been found that the interventional instrument can be clearly and accurately tracked in the magnetic resonance images when use is made of such an indicator element.

The indicator element is constructed, for example as a strip which extends in a direction transversely to the longitudinal axis of the holder. By rotation of the interventional instrument about the longitudinal axis it is achieved that the strip is oriented parallel to the steady magnetic field or transversely to (preferably perpendicularly to) the steady magnetic field. When the strip extends parallel to the steady magnetic field, it causes hardly any or no influencing of the magnetic resonance image. When the strip extends more or less transversely to the steady magnetic field, it causes a given influencing of the magnetic resonance image. The influencing is dependent on the angle enclosed by the strip relative to the steady magnetic field. Influencing is maximum when the strip extends perpendicularly to the steady magnetic field. The indicator element may alternatively include a plurality of paramagnetic strips, said strips being arranged in such a manner that, when the interventional instrument is used during operation of the magnetic resonance imaging system, the strips are non-rotationally symmetrically arranged relative to the steady magnetic field.

The indicator element preferably includes a number of segments of different magnetic susceptibility. For example, the indicator element includes strips with segments in the form of parts of the strip of different materials with a different magnetic susceptibility. In another embodiment the segments are formed by separate parts of the strip whose respective dimensions differ in the direction transversely to the axis of the holder. The indicator element with a plurality of segments of different susceptibility causes a plurality of disturbances in the magnetic resonance image; these disturbances occur at distances from one another which correspond to the distances between the individual segments. Preferably, the separate segments of the indicator element are arranged at regular distances from one another. It is thus achieved that the respective segments cause disturbances in the magnetic resonance image which occur at regular distances from one another therein. A regular pattern of this kind, for example a row of disturbances at mutually equal distances, can be used as a distance scale in the magnetic resonance image. Using this distance scale, the interventional instrument can be readily displaced over a desired distance within the body of the patient. The interventional instrument can thus be accurately moved to a desired position while effectively avoiding unnecessary damaging of tissue.

A preferred embodiment of a magnetic resonance imaging system is arranged to perform a first type of magnetic resonance imaging sequence to generate magnetic resonance signals mainly relating to an interventional instrument which is introduced in an object to be examined and to perform a second type of magnetic resonance imaging sequence to generate magnetic resonance signals mainly relating to said body to be examined. Preferably the magnetic resonance imaging system is arranged to perform the MR imaging of the interventional instrument on the one hand and of the body into which the interventional instrument is introduced on the other hand on the basis of different magnetic resonance imaging sequences. Thus it is made possible to optimise both the imaging of the interventional instrument on the basis of magnetic resonance signals influenced or generated by the indicator element as well as the imaging of the tissue of the patient to be examined.

BRIEF DESCRIPTION OF THE DRAWING

These and other aspects of the invention are apparent from and will be elucidated, by way of non-limitative example, with reference to the embodiments described hereinafter and shown in the drawing; therein.

DETAILED DESCRIPTION OF THE PREFERRED EMBODIMENT

Figure 1:
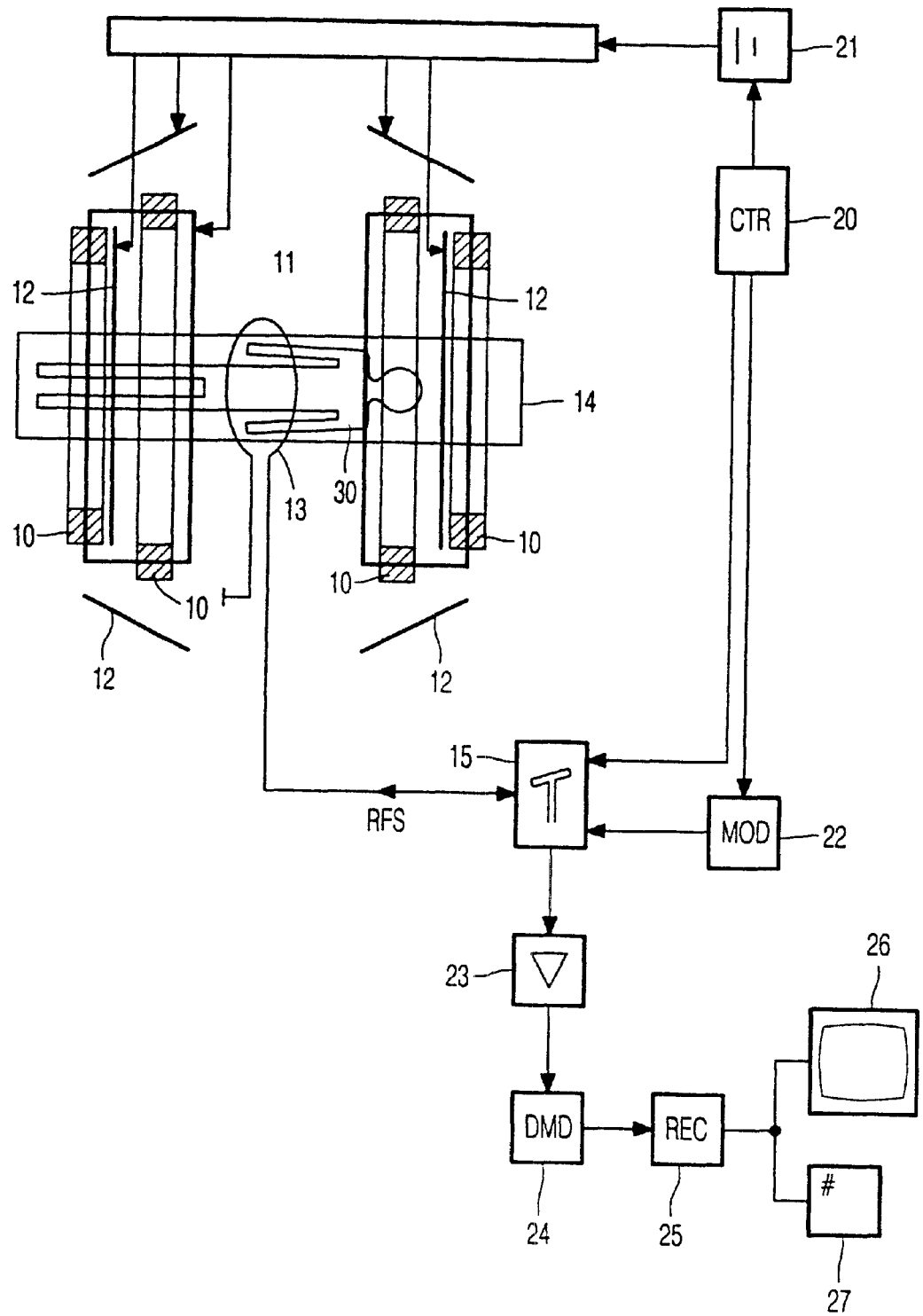
FIG. 1 is a diagrammatic representation of a magnetic resonance imaging system according to the invention.

FIG. 1 is a diagrammatic representation of a magnetic resonance imaging system according to the invention. The magnetic resonance imaging system includes a main magnet 10 which generates a steady magnetic field in an examination space 11 in which a part of the patient 30 to be examined is arranged. For example, the main magnet has a cylindrical bore which is so large that it can accommodate the relevant part of the patient to be examined. The steady magnetic field in the bore is essentially spatially uniform. At the center of the bore a spatial uniformity of the steady magnetic field is realized such that the relative deviations of the uniformity do not amount to more than $5.10^{-6}$. The main magnet is arranged in an examination room which is shielded against RF electromagnetic fields in order to prevent the operation of the magnetic resonance imaging system from being disturbed by RF signals from outside the examination room and by spurious RF signals generated by the control systems of the magnetic resonance imaging system itself. The magnetic resonance imaging system also includes gradient coils 12. The gradient coils 12 generate spatial gradients in the magnetic field in the examination space. Furthermore, the magnetic resonance imaging system includes a transmitter coil 13 and a receiver coil 13. Usually the same coil or antenna is used alternately as the transmitter coil and the receiver coil. The transmitter-and receiver coil, furthermore, is usually shaped as a coil but other geometries where the transmitter and receiver coil acts as a transmitter and receiver antenna for RF electromagnetic signals are also feasible. The transmitter and receiver coil 13 is connected to an electronic transmitter/receiver circuit 15.

The patient 30 to be examined is arranged on a patient table 14 and moved into the bore of the main magnet in such a manner that the part of the body of the patient to be examined in the examination space is situated approximately at the center of the bore. Using the gradient coils 12, a selection gradient is applied in order to select a thin slice in the examination space. Subsequently, the transmitter coil emits an RF electromagnetic excitation pulse whereby the spins in the body of the patient to be examined and in the selected slice are excited. The RF electromagnetic excitation pulse is an FM or AM modulated signal with a modulation frequency amounting to some tens of MHz. The excited spins emit RF resonance signals which are received by the receiver coil 13. A reconstruction unit 25 derives an image signal (IS), representing an image of a cross-section in the selected slice of the body of the patient to be examined, from the RF resonance signals (RFS). For example, the transmitter coil 13 generates one or more refocusing pulses so that the excited spins have one or more spin echoes where the RF resonance signals are emitted which are received by the receiver coil. After the excitation of the spins in the selected slice, the gradient coils 12 apply a phase encoding gradient field, also referred to as a preparation gradient field, for a predetermined period of time; this gradient field renders the phase of the precession (the Larmor precession) of the excited spins location-dependent in a phase encoding direction in the selected slice. After the emission of the refocusing pulse, the gradient coils 12 apply a read-out gradient field, also referred to as a measuring gradient field, whereby the precessional frequencies (the Larmor frequencies) of the excited spins in the selected slice are rendered location-dependent in the direction of the read-out gradient field. Because of the phase encoding gradient field and the read-out gradient field, the RF resonance signals have a plurality of frequency components which encode the spatial positions in the selected slice. The signal levels of these frequency components of the RF resonance signals represent the spin densities in the selected slice and these spin densities themselves represent the density and the type of tissue in the selected slice. Using inter alia Fourier analysis of the RF resonance signals, an image, being the magnetic resonance image, of a cross-section in the selected slice of the patient to be examined can thus be reconstructed from the RF resonance signals.

The gradient coils 12 are energized by means of a power supply unit 21 whereto the various gradient coils 12 are connected. The power supply unit 21 is controlled by a front-end controller 20. The function of the front-end controller 20 is carried out, for example by a suitably programmed electronic processor. Furthermore, the transmitter and receiver circuit 15 is connected to a modulator 22. The modulator 22 and the transmitter/receiver 15 activate the transmitter coil 13 so as to transmit the RF excitation and refocusing pulses. The receiver coil is connected to a pre-amplifier 23. The pre-amplifier 23 amplifies the RF resonance signal (RFS) received by the receiver coil and the amplified RF resonance signal is applied to a demodulator 24. The demodulator 24 demodulates the amplified RF resonance signal. The demodulated resonance signal contains the actual information concerning the local spin densities in the selected slice. Using Fourier transformation and inverse Radon transformation, a reconstruction unit 25 derives an image signal (IS) which represents the image information of the spin densities in the selected slice. The image of the selected slice is displayed on a monitor 26; to this end, the image signal (IS) is applied to the monitor 26. The image signal (IS) is also stored in a buffer unit 27 while awaiting further processing or printing as a hard copy.

The front-end controller 20 also controls the transmitter/receiver circuit 15. The pre-amplifier 23 is blocked during the period of time that the transmitter coil transmits the excitation pulses or the refocusing pulses; during that period the transmitter/receiver circuit is tuned by the front-end controller 20 so as to ensure that the pulses transmitted by the transmitter coils do not damage the transmitter/receiver circuit 15 and the pre-amplifier 23. The front-end controller 20 tunes the transmitter/receiver circuit 15 for very sensitive reception of the RF resonance.

Figure 2:
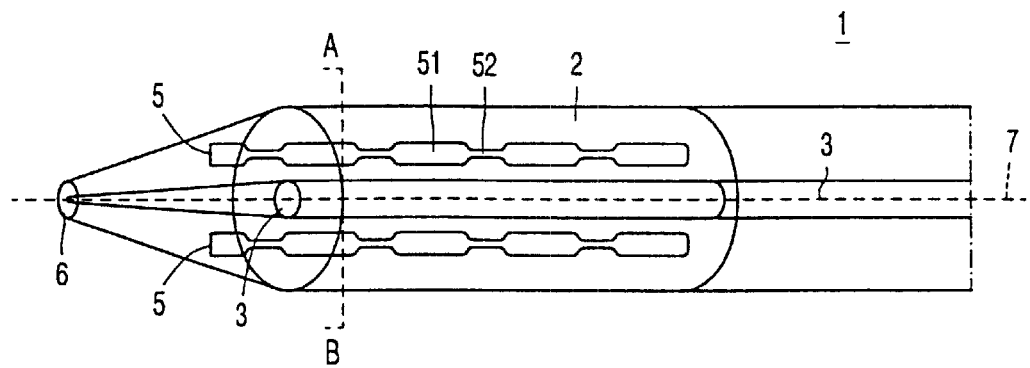
FIG. 2 is a diagrammatic representation in the form of a partly cut-away side elevation of a first embodiment of the interventional instrument according to the invention.

FIG. 2 is a diagrammatic representation, in the form of a partly cut-away side elevation, of an interventional instrument according to the invention. The invention can be used for a solid interventional instrument as well as a hollow interventional instrument. Such a hollow interventional instrument includes a holder 2 in which a cylindrical cavity 3 is recessed so as to extend along the axis of the holder. The cylindrical cavity 3 is referred to as the "lumen". The holder terminates as a needle-shaped tip at a distal end 6. The interventional instrument 1 is thus formed as a hollow needle. Thin cables or rods can be guided through the lumen; such cables or rods serve for the electrical or mechanical operation of a surgical instrument which can be coupled to the distal end of the interventional instrument. Liquids such as medication, physiological solutions or contrast agents can also be supplied via the lumen. The interventional instrument may also be constructed as a biopsy needle for the removal of pieces of tissue from the body of the patient. The holder 2 is preferably made from a material having a very low magnetic susceptibility; for example, the holder 2 is made from plastic or a ceramic material.

Figure 3:
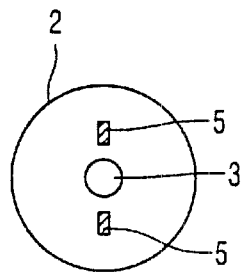
FIG. 3 is a diagrammatic cross-sectional view of the interventional instrument shown in FIG. 2.

The interventional instrument 1 is also provided with the indicator element 5 in the form of two paramagnetic strips 5 which are provided transversely of the axis of the lumen and in the vicinity of the distal end of the interventional instrument. The paramagnetic strips 5 are, for example strips 5 of a plastic compound such as polyurethane or nylon in which a paramagnetic material is included. Such a paramagnetic material is, for example copper, manganese, chromium, nickel or notably gadolinium or dysprosium. Particularly attractive results are achieved by means of gadolinium and dysprosium, because these metals have a very high magnetic susceptibility. For example, a concentration of from 10% to 30% of the paramagnetic material in the compound is used to realize a suitable degree of influencing of the magnetic resonance image by the indicator element. The strips 5 extend in a direction transversely of the longitudinal axis of the interventional instrument. Rotation of the interventional instrument about the longitudinal axis rotates the strips 5 relative to the direction of the steady magnetic field when the interventional instrument has been introduced into the patient arranged in the steady magnetic field. In the example shown in the FIGS. 2 and 3 the indicator element is constructed in the form of two strips, but it is alternatively possible to utilize an indicator element comprising only a single strip or three or more strips.

The strips 5 as shown in FIG. 2 are notably constructed so as to have a plurality of segments 51, 52. For example, there are wide segments 51 and narrow segments 52. The wide segments 51 extend further in the direction transversely the the longitudinal axis 7 of the interventional instrument than do the narrow segments. It is thus achieved that when the interventional instrument with the strips is arranged in the steady magnetic field of the magnetic resonance imaging system, the wide segments 51 cause a local distortion of the steady magnetic field which is stronger than that caused by the narrow segments 52. The wide segments 51 thus locally influence the magnetic resonance image more than the narrow segments 51. The indicator element with strips having a plurality of wide and narrow segments thus produces a pattern of distortions which can be used as a distance scale in the magnetic resonance image.

Figure 4:
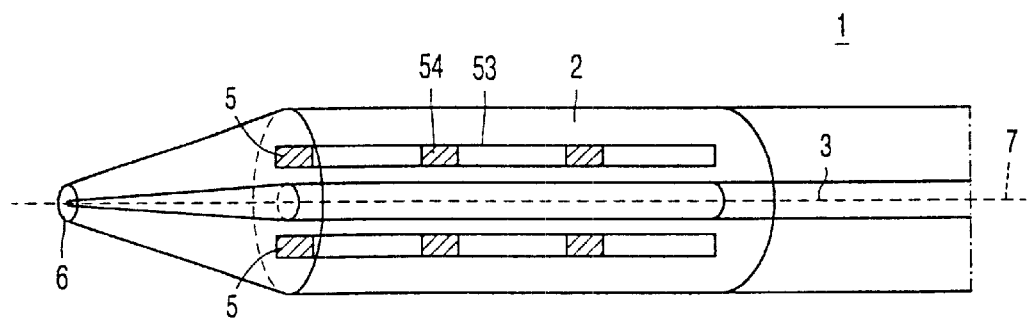
FIG. 4 is a diagrammatic representation in the form of a partly cut-away side elevation of a second embodiment of the interventional instrument according to the invention.

FIG. 4 is a diagrammatic representation, in the form of a partly cut-away side elevation, of a second embodiment of the interventional instrument according to the invention. The indicator element of the interventional instrument shown in FIG. 4 includes a plurality of passive segments 53 and a plurality of active segments 54. The active segments are preferably made from a material having a magnetic susceptibility which deviates significantly from the magnetic susceptibility of the holder 2; for example, the active segments are made from a paramagnetic material, for example copper, manganese, chromium, nickel or notably gadolinium or dysprosium. The passive elements are made from a material having a very low magnetic susceptibility, such as plastic or a ceramic material.

All references cited herein, as well as the priority document European Patent Application 98204105.5 filed Dec. 3, 1998, are incorporated herein by reference in their entirety and for all purposes to the same extent as if each individual publication or patent or patent application was specifically and individually indicated to be incorporated by reference in its entirety for all purposes.

What is claimed is:

1. A system comprising:
    a magnetic resonance imaging system, and
    an interventional instrument which is provided with an indicator element for influencing a magnetic resonance image obtainable by the magnetic resonance imaging system,
    wherein the degree of influencing of the magnetic resonance image is adjustable, and wherein the magnetic resonance imaging system further comprises a main magnet system for applying a steady magnetic field, and
    wherein the degree of influencing of the magnetic resonance image can be adjusted on the basis of the orientation of the indicator element relative to the steady magnetic field.

2. A magnetic resonance imaging system as claimed in claim 1, wherein the interventional instrument further comprises a holder, such that the magnetic susceptibility of the indicator element significantly deviates from the magnetic susceptibility of the holder.

3. A magnetic resonance imaging system as claimed in claim 1 wherein the indicator element further copise a plurality of individual segments, the individual segments causing a different degree of influencing of the magnetic resonance image.

4. A magnetic resonance imaging system as claimed in claim 3 wherein individual segments have a different magnetic susceptibility.

5. The system of claim 3 wherein the indicator element further comprises one or more strips which are arranged so as to extend transversely to the longitudinal axis of the holder.

6. A magnetic resonance imaging system as claimed in claim 1, wherein the indicator element further comprises one or more strips which are arranged so as to extend transversely to the longitudinal axis of the holder.

7. An interventional instrument for use with a magnetic resonance imaging system comprising an indicator element for influencing a magnetic resonance image obtainable by the magnetic resonance imaging system, wherein the degree of influencing of the magnetic resonance image is adjustable, and wherein the degree of influencing of the magnetic resonance image can be adjusted on the basis of the orientation of the indicator element relative to a steady magnetic field generated by the magnetic resonance imaging system.

8. A magnetic resonance imaging system with a main magnet for applying a steady state magnetic field, comprising means for performing a first type of magnetic resonance imaging sequence to generate magnetic resonance signals mainly relating to an interventional instrument which is introduced in an object to be examined, and for performing a second type of magnetic resonance imaging sequence to generate magnetic resonance signals mainly relating to said body to be examined, wherein said means for performing a first type of magnetic resonance imaging sequence include an indicator which is adjustable by adjusting the orientation of the indicator relative the steady state field.

* * * * *